(12) United States Patent
Do et al.

(10) Patent No.: US 7,851,846 B2
(45) Date of Patent: Dec. 14, 2010

(54) NON-VOLATILE MEMORY CELL WITH BURIED SELECT GATE, AND METHOD OF MAKING SAME

(75) Inventors: Nhan Do, Saratoga, CA (US); Hieu V. Tran, San Jose, CA (US); Amitay Levi, Cupertino, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 189 days.

(21) Appl. No.: 12/327,114

(22) Filed: Dec. 3, 2008

(65) Prior Publication Data
US 2010/0133602 A1   Jun. 3, 2010

(51) Int. Cl.
*H01L 29/788* (2006.01)
*H01L 21/28* (2006.01)
(52) U.S. Cl. .............. 257/320; 257/319; 257/E29.3; 257/E21.179; 438/257; 438/267
(58) Field of Classification Search ........... 257/319, 257/320, E29.3, E21.179; 438/257, 267
See application file for complete search history.

(56) References Cited

U.S. PATENT DOCUMENTS

| | | | |
|---|---|---|---|
| 5,572,054 A | 11/1996 | Wang et al. | |
| 5,780,341 A | 7/1998 | Ogura | |
| 6,747,310 B2 | 6/2004 | Fan et al. | |
| 6,885,586 B2 | 4/2005 | Chen et al. | |
| 6,891,220 B2 | 5/2005 | Yeh et al. | |
| 6,894,339 B2 | 5/2005 | Fan et al. | |
| 6,917,069 B2 | 7/2005 | Kianian et al. | |
| 6,952,033 B2 | 10/2005 | Kianian et al. | |
| 6,952,034 B2 | 10/2005 | Hu et al. | |
| 7,315,056 B2 | 1/2008 | Klinger et al. | |
| 7,411,246 B2 | 8/2008 | Kianian | |
| 2004/0130947 A1* | 7/2004 | Fan et al. | 365/185.05 |
| 2004/0212006 A1* | 10/2004 | Harari et al. | 257/315 |
| 2005/0146937 A1* | 7/2005 | Fan et al. | 365/185.17 |
| 2005/0250335 A1* | 11/2005 | Huang et al. | 438/700 |
| 2006/0160305 A1* | 7/2006 | Mokhlesi et al. | 438/257 |
| 2007/0252192 A1* | 11/2007 | Mokhlesi et al. | 257/315 |
| 2009/0242959 A1* | 10/2009 | Lin et al. | 257/319 |

* cited by examiner

*Primary Examiner*—Victor A Mandala
(74) *Attorney, Agent, or Firm*—DLA Piper LLP (US)

(57) ABSTRACT

A memory device, and method of making the same, in which a trench is formed into the surface of a semiconductor substrate. Source and drain regions define a channel region there between. The drain is formed under the trench. The channel region includes a first portion that extends along a bottom wall of the trench, a second portion that extends along a sidewall of the trench, and a third portion that extends along the surface of the substrate. The floating gate is disposed over the channel region third portion. The control gate is disposed over the floating gate. The select gate is at least partially disposed in the trench and adjacent to the channel region first and second portions. The erase gate disposed adjacent to and insulated from the floating gate.

18 Claims, 4 Drawing Sheets

NON-VOLATILE MEMORY CELL WITH BURIED SELECT GATE, AND METHOD OF MAKING SAME

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is a constant need to shrink the size of the memory cell arrays in order to maximize the number of memory cells on a single wafer, while not sacrificing performance (i.e., program, erase and read efficiencies and reliabilities). It is well known that forming memory cells in pairs, with each pair sharing a single source region, and with adjacent pairs of cells sharing a common drain region, reduces the size of the memory cell array. It is also known to form trenches into the substrate, and locate one or more memory cell elements in the trench to increase the number of memory cells that fit into a given unit surface area (see for example U.S. Pat. Nos. 5,780, 341 and 6,891,220). However, such memory cells use the control gate to both control the channel region (in a low voltage operation) and to erase the floating gate (in a high voltage operation). This means the control gate is both a low voltage and high voltage element, making it difficult to surround it with sufficient insulation for high voltage operation while not being too electrically isolated for low voltage operation. Moreover, the proximity of the control gate to the floating needed for an erase operation can result in unwanted levels of capacitive coupling between the control gate and the floating gate.

U.S. Pat. No. 6,747,310, which is incorporated herein by reference for all purposes, discloses a flash memory cell design that further includes an erase gate and a select gate (and a method of making them same in a self aligned manner). In this design, the channel region running along the surface of the substrate is controlled in part by a select gate and in part by the floating gate. The control gate is used to capacitively couple to the floating gate for programming, and the erase gate is used to remove the electrons from the floating gate.

However, as the dimensions of the memory cell get smaller and smaller, it becomes more difficult to efficiently program the memory cell. Specifically, the portion of the channel region under the select gate used to generate hot electrons becomes too short for efficient hot electron injection programming.

Thus it is an object of the present invention to create a memory cell configuration and method of manufacture where the memory cell elements are self aligned to each other, and where smaller geometries can be achieved without sacrificing (and in fact improving) programming efficiency.

SUMMARY OF THE INVENTION

The aforementioned problems and needs are addressed by providing for an electrically programmable and erasable memory device that includes a substrate of semiconductor material having a first conductivity type and a surface, a trench formed into the surface of the substrate, first and second spaced-apart regions formed in the substrate and having a second conductivity type, with a channel region in the substrate there between, wherein the second region is formed under the trench, and the channel region includes a first portion that extends substantially along a bottom wall of the trench, a second portion that extends substantially along a sidewall of the trench, and a third portion that extends substantially along the surface of the substrate, an electrically conductive floating gate disposed over and insulated from the channel region third portion for controlling a conductivity of the channel region third portion, an electrically conductive control gate disposed adjacent to and insulated from the floating gate, an electrically conductive select gate at least partially disposed in the trench and adjacent to and insulated from the channel region first and second portions for controlling a conductivity of the channel region first and second portions, and an electrically conductive erase gate disposed adjacent to and insulated from the floating gate.

An array of electrically programmable and erasable memory devices includes a substrate of semiconductor material having a first conductivity type and a surface, spaced apart isolation regions formed on the substrate which are substantially parallel to one another and extend in a first direction, with an active region between each pair of adjacent isolation regions, and each of the active regions including a plurality of pairs of memory cells. Each of the memory cell pairs includes a pair of trenches formed into the surface of the substrate, a pair of second regions each formed in the substrate under one of the pair of trenches, a first region formed in the substrate, wherein a pair of channel regions are each in the substrate between the first region and one of the second regions, wherein the first and second regions have a second conductivity type, and wherein each of the channel regions includes a first portion that extends substantially along a bottom wall of one of the trenches, a second portion that extends substantially along a sidewall of that one trench, and a third portion that extends substantially along the substrate surface, a pair of electrically conductive floating gates each disposed over and insulated from one of the channel region third portions for controlling a conductivity of that channel region third portion, a pair of an electrically conductive control gates disposed adjacent to and insulated from one of the floating gates, a pair of electrically conductive select gates each at least partially disposed in one of the trenches and adjacent to and insulated from one of the channel region first and second portions for controlling a conductivity of those channel region first and second portions, and an electrically conductive erase gate disposed adjacent to and insulated from the pair of floating gates.

A method of forming a semiconductor memory cell includes forming a trench into a surface of the substrate of semiconductor material having a first conductivity type, forming first and second spaced-apart regions in the substrate having a second conductivity type, with a channel region in the substrate there between, wherein the second region is formed under the trench, and the channel region includes a first portion that extends substantially along a bottom wall of the trench, a second portion that extends substantially along a sidewall of the trench, and a third portion that extends substantially along the surface of the substrate, forming an electrically conductive floating gate disposed over and insulated from the channel region third portion for controlling a conductivity of the channel region third portion, forming an electrically conductive control gate disposed adjacent to and insulated from the floating gate, forming an electrically conductive select gate at least partially disposed in the trench and adjacent to and insulated from the channel region first and second portions for controlling a conductivity of the channel region first and second portions, and forming an electrically conductive erase gate disposed adjacent to and insulated from the floating gate.

A method of forming an array of electrically programmable and erasable memory devices includes forming spaced apart isolation regions on a semiconductor substrate that are substantially parallel to one another and extend in a first direction, with an active region between each pair of adjacent isolation regions, wherein the substrate has a surface and a first conductivity type, and forming a plurality of pairs of memory cells in each of the active regions. The formation of each of the memory cell pairs includes: forming a pair of trenches into the surface of the substrate, forming a pair of second regions in the substrate each disposed under one of the pair of trenches, forming a first region in the substrate, wherein a pair of channel regions are each in the substrate between the first region and one of the second regions, wherein the first and second regions have a second conductivity type, and wherein each of the channel regions includes a first portion that extends substantially along a bottom wall of one of the trenches, a second portion that extends substantially along a sidewall of that one trench, and a third portion that extends substantially along the substrate surface, forming a pair of electrically conductive floating gates each disposed over and insulated from one of the channel region third portions for controlling a conductivity of that channel region third portion, forming a pair of an electrically conductive control gates disposed adjacent to and insulated from one of the floating gates, forming a pair of electrically conductive select gates each at least partially disposed in one of the trenches and adjacent to and insulated from one of the channel region first and second portions for controlling a conductivity of those channel region first and second portions, and forming an electrically conductive erase gate disposed adjacent to and insulated from the pair of floating gates.

Other objects and features of the present invention will become apparent by a review of the specification, claims and appended figures.

DETAILED DESCRIPTION OF THE PREFERRED EMBODIMENTS

The method of the present invention is illustrated in FIGS. 1A to 1F and 2A to 2E (which show the processing steps in making the memory cell array of the present invention). The method begins with a semiconductor substrate 10, which is preferably of P type and is well known in the art. The thicknesses of the layers described below will depend upon the design rules and the process technology generation. What is described herein is for the 0.09 urn micron process. However, it will be understood by those skilled in the art that the present invention is not limited to any specific process technology generation, nor to any specific value in any of the process parameters described hereinafter.

Isolation Region Formation

Figure 1A:
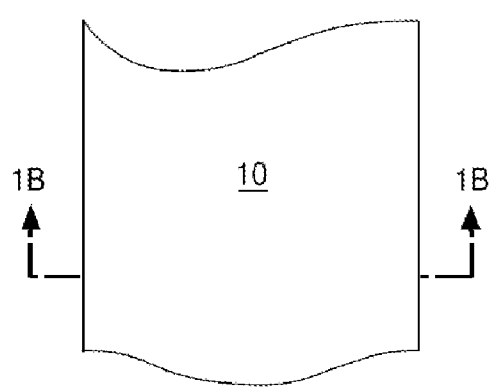
FIG. 1A is a top view of a semiconductor substrate used in the first step of the method of present invention to form isolation regions.
Figure 1B:
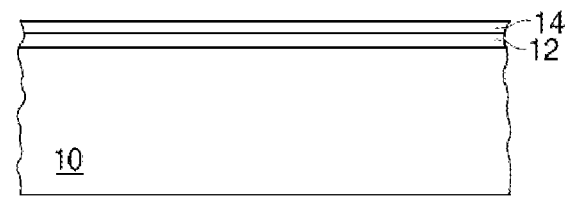
FIG. 1B is a cross sectional view of the structure taken along the line 1B-1B showing the initial processing steps of the present invention.

FIGS. 1A to 1F illustrate the well known STI method of forming isolation regions on a substrate. Referring to FIG. 1A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD) to a thickness of approximately 50-150 Å. Nitrogen doped oxide or other insulation dielectrics can also be used. Second layer 14 can be silicon nitride (hereinafter "nitride"), which is formed over oxide layer 12 preferably by CVD or PECVD to a thickness of approximately 1000-5000 Å. FIG. 1B illustrates a cross-section of the resulting structure.

Figure 1D:
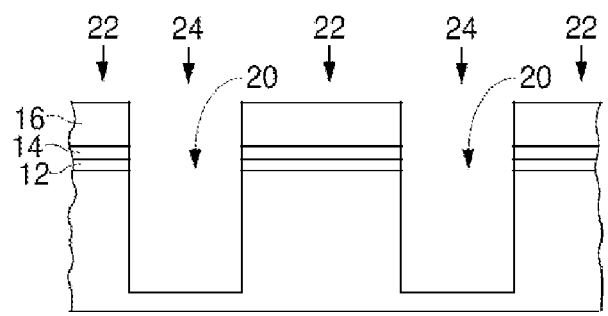
FIG. 1D is a cross sectional view of the structure in FIG. 1C taken along the line 1D-1D showing the isolation trenches formed in the structure.
Figure 1C:
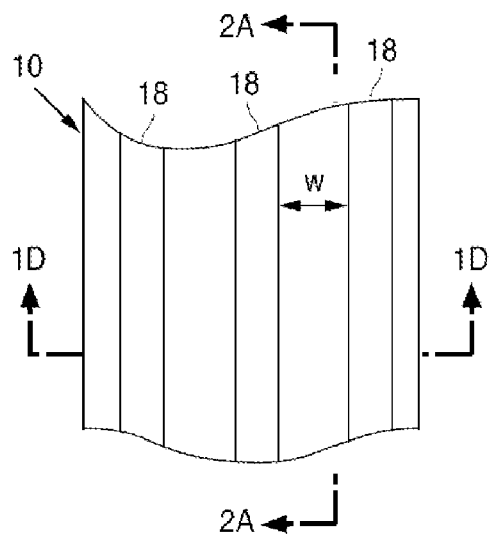
FIG. 1C is a top view of the structure showing the next step in the processing of the structure of FIG. 1B, in which isolation regions are defined.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide/dielectric etch processes) to form trenches 20 in the structure. The distance W between adjacent stripes 18 can be as small as the smallest lithographic feature of the process used. A silicon etch process is then used to extend trenches 20 down into the silicon substrate 10 (e.g. to a depth of approximately 500 Å to several microns), as shown in FIG. 1D.

Where the photo resist 16 is not removed, the nitride layer 14 and oxide layer 12 are maintained. The resulting structure illustrated in FIG. 1D now defines active regions 22 interlaced with isolation regions 24.

Figure 1E:
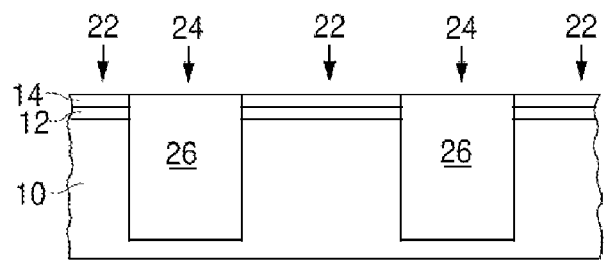
FIG. 1E is a cross sectional view of the structure in FIG. 1D showing the formation of isolation blocks of material in the isolation trenches.

The structure is further processed to remove the remaining photo resist 16. Then, an isolation material such as silicon dioxide is formed in trenches 20 by depositing a thick oxide layer, followed by a Chemical-Mechanical-Polishing or CMP etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed on the substrate surface in stripe regions 18. FIGS. 1A to 1F illustrate the memory cell array region of the substrate, in which columns of memory cells will be formed in the active regions 22 which are separated by the isolation regions 24. It should be noted that the substrate 10 also includes at least one periphery region (not shown) in which control circuitry is formed that will be used to operate the memory cells formed in the memory cell array region. Preferably, isolation blocks 26 are also formed in the periphery region during the same STI or LOCOS process described above.

Memory Cell Formation

Figure 1F:
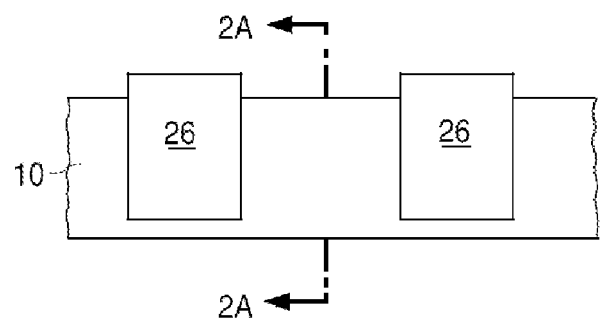
FIG. 1F is a cross sectional view of the structure in FIG. 1E showing the final structure of the isolation regions.

The structure shown in FIG. 1F is further processed as follows. FIGS. 2A to 2E show the cross sections of the structure in the active regions 22 from a view orthogonal to that of FIG. 1F (along line 2A-2A as shown in FIGS. 1C and 1F), as the next steps in the process of the present invention are performed concurrently in both regions.

Figure 2A:
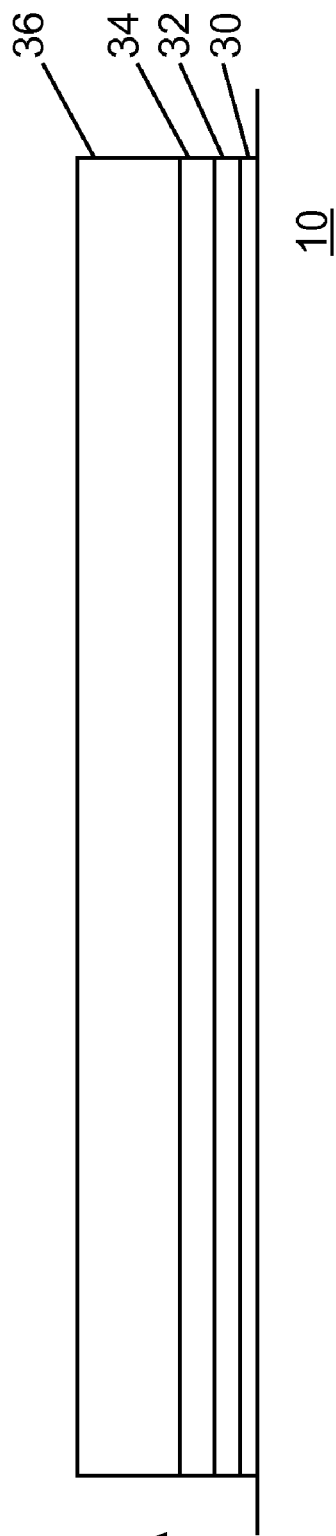
FIGS. 2A-2E are cross sectional views of the semiconductor structure in FIG. 1F taken along the line 2A-2A showing in sequence the steps in the processing of the semiconductor structure in the formation of a non-volatile memory array of floating gate memory cells of the present invention.

An insulation layer 30 (preferably oxide or nitrogen doped oxide) is first formed over the substrate 10. The active region portions of the substrate 10 can be doped at this time for better independent control of the cell array portion of the memory device relative to the periphery region. Such doping is often referred to as a $V_t$ implant or cell well implant, and is well known in the art. During this implant, the periphery region is protected by a photo resist layer, which is deposited over the entire structure and removed from just the memory cell array region of the substrate. Next, a layer of polysilicon 32 (hereinafter "poly") is formed with a thickness of approximately 1000-2000 over oxide layer 30. At this point, a combination of poly CMP and etch back, with or without a lithography masking step, is performed to limit the width direction of poly layer 32 (i.e. to remove the portions of poly layer 32 in the isolations regions 24). Then, another insulation layer 34 is formed (preferably of oxide, but could instead be a composite of oxide, nitride, oxide sub-layers) over poly layer 32, followed by the formation of another poly layer 36 over oxide layer 34. The resulting structure is shown in FIG. 2A.

Figure 2B:
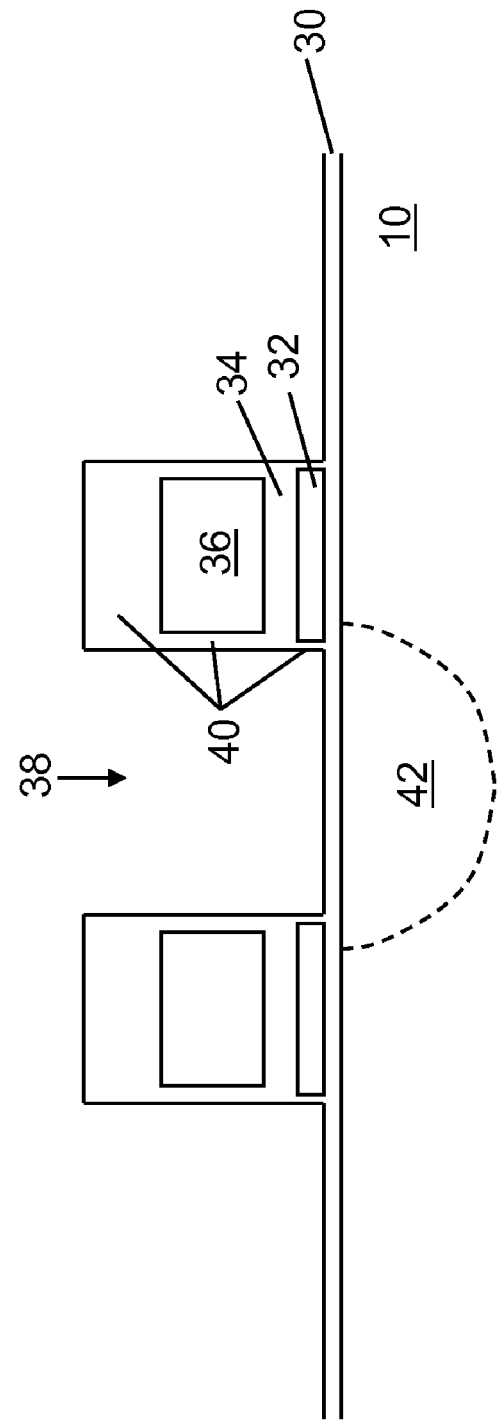

A plurality of parallel second trenches 38 are formed in the poly, oxide, poly layers 36, 34, 32 by applying a photo resist (masking) material on the poly layer 36, and then performing a masking step to remove the photo resist material from selected parallel stripe regions. Anisotropic poly and oxide (or combination oxide/nitride/oxide) etches are used to remove the exposed portions of poly and oxide layers 36 and 34 in the stripe regions, leaving second trenches 38 that extend down to and expose poly layer 32. A combination of high temperature oxide (HTO) deposition, nitride deposition, and oxidation is then used to create insulation layer 40 on the exposed portions of poly layer 36. Poly layer 32 is then etched in a self aligned manner with layer 40 to create blocks of the poly layer 32 in the memory cell length direction (which will constitute the floating gates). With a masking step, suitable ion implantation that, depending upon if the substrate is P or N type, may include arsenic, phosphorous, boron and/or antimony (and possible anneal), is then made across the surface of the structure to form first (source) regions 42 in the substrate portions at the bottom of second trenches 36. The source regions 42 are self-aligned to the second trenches 38, and have a second conductivity type (e.g. N type) that is different from a first conductivity type of the substrate (e.g. P type). The resulting structure is illustrated in FIG. 2B, where pairs of poly blocks 36/32 are separated by a source region 42.

Figure 2C:
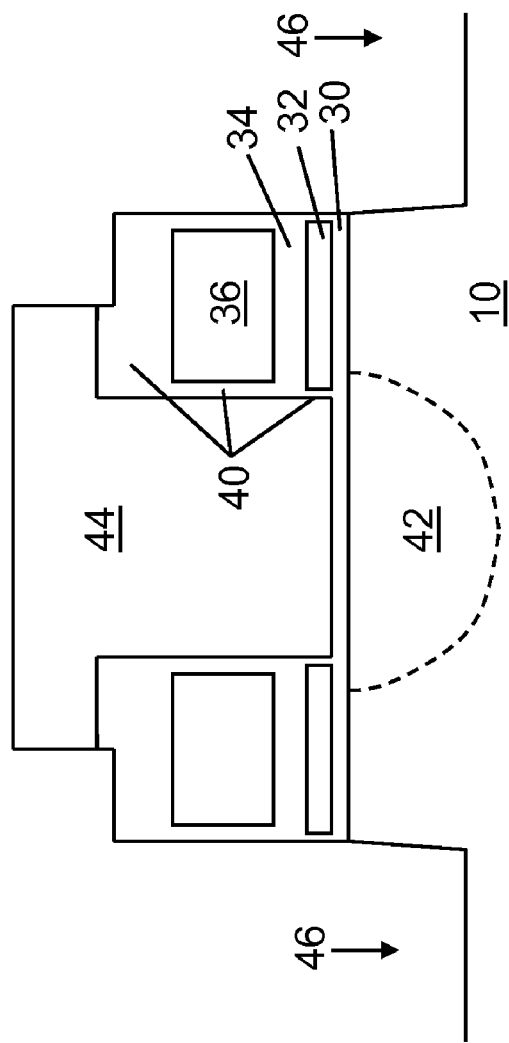

A masking step is used to fill second trenches 38 with photoresist 44, which also covers a portion of layer 40. An anisotropic oxide etch is then used to remove exposed portions of oxide layer 30, exposing substrate 10. A silicon anisotropic etch process is then used to form third trenches 46 down into the substrate 10 in each of the active regions 22 (for example, down to a depth of approximately one feature size deep, e.g. about 500 Å to several microns with 0.09 um technology). At this point, P-type implantation can be used to adjust the threshold voltage of the select (WL) transistor. This can be done in combination with the peripheral logic transistor formation. The resulting structure is illustrated in FIG. 2C.

Figure 2D:
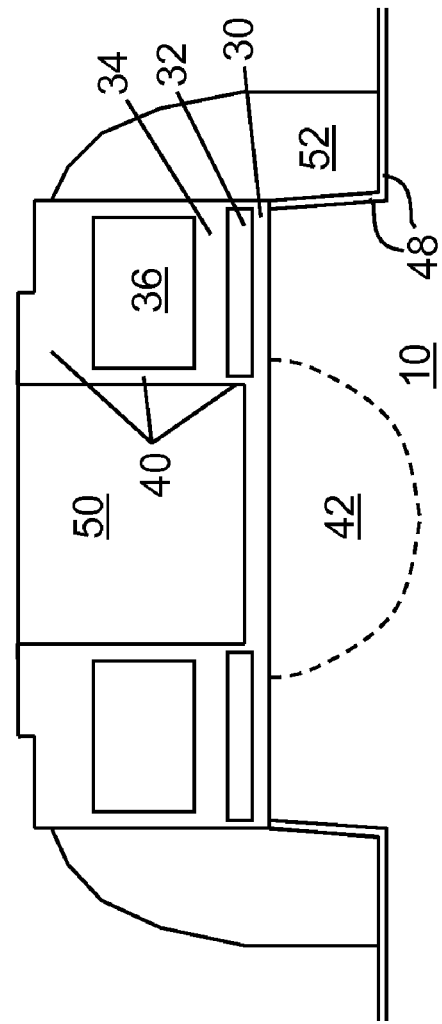

After photoresist 44 is removed, a thermal oxidation process is performed to form oxide layer 48 on the exposed portions of substrate 10 along the sidewalls and bottoms of third trenches 46. This oxidation process also thickens oxide layer 30 at the bottom of second trenches 38. A thick layer of polysilicon is then formed over the structure, followed by a poly etch back process, which fills second trenches 38 with poly blocks 50, and forms poly spacers 52 in third trenches 46. This layer of polysilicon can also be used for gate formation in peripheral region devices. The resulting structure is illustrated in FIG. 2D.

An oxide deposition and anisotropic etch are used to form oxide spacers 54 on the outer sides of poly spacers 52. Suitable ion implantation (and anneal) is used to form second (drain) regions 56 in the substrate 10. Insulation material 58, such as BPSG or oxide, is then formed over the entire structure. A masking step is performed to define etching areas over the drain regions 56. The insulation material 58 is selectively etched in the masked regions to create contact openings that extend down to drain regions 56. The contact openings are then filled with a conductor metal (e.g. tungsten) to form metal contacts 60 that are electrically connected to drain regions 56. The final active region memory cell structure is illustrated in FIG. 2E.

Figure 2E:
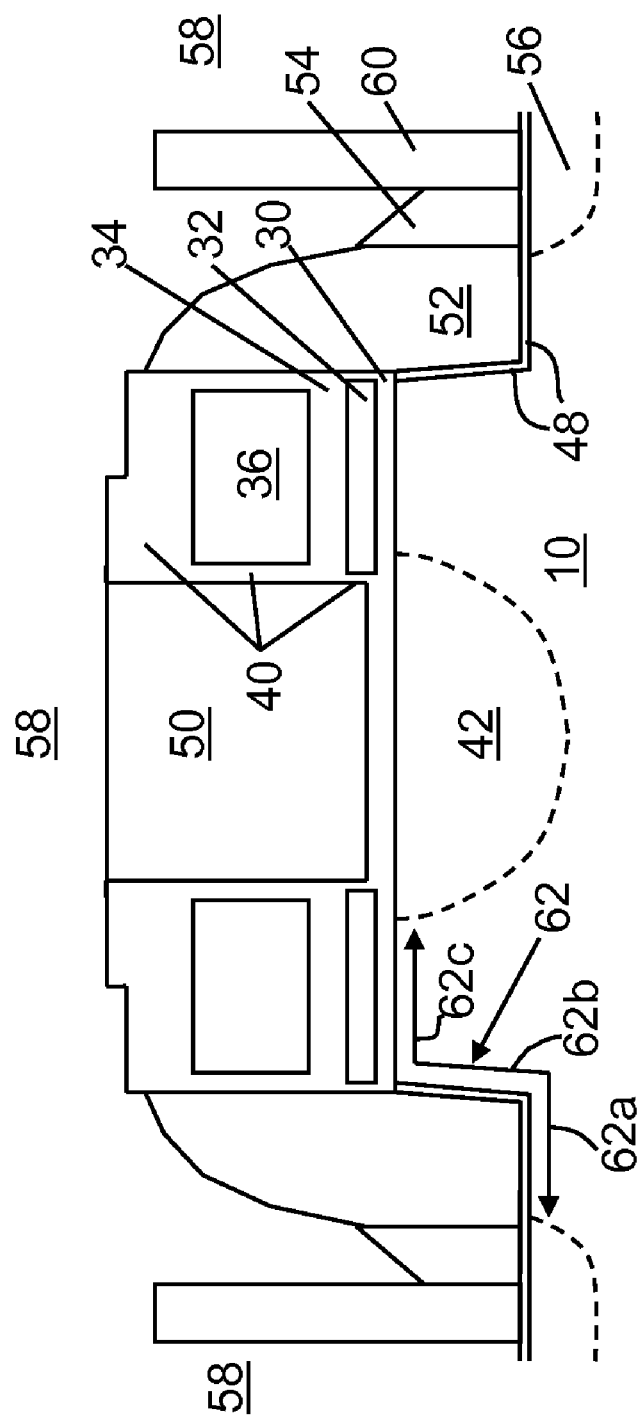

As shown in FIG. 2E, the process of the present invention forms pairs of memory cells that mirror each other, with a memory cell formed on each side of (and sharing) poly block 50. For each memory cell, first and second regions 42/56 form the source and drain regions respectively (although those skilled in the art know that source and drain can be switched during operation). Poly block 32 constitutes the floating gate, poly block 36 constitutes the control gate, poly spacer 52 constitutes the select gate, and poly block 50 constitutes the erase gate. Channel regions 62 for each memory cell are defined in the surface portion of the substrate that is in-between the source and drain 42/56. Each channel region 62 includes three portions: a first (horizontal) portion 62a under third trench 46 (and under select gate 52), a second (vertical) portion 62b extending along the vertical wall of filled third trench 46 (and along select gate 52), and a third (horizontal)

portion 62c extending along the surface of the substrate 10 between the sidewall of filled third trench 46 and the source region 42. Each pair of memory cells share a common source region 42 that is disposed under filled second trench 38 and a common erase gate 50. Similarly, each drain region 56 is shared between adjacent memory cells from different mirror sets of memory cells.

Memory Cell Operation

The operation of the memory cells will now be described. Some aspects of the operation and the theory of operation of such memory cells are also described in U.S. Pat. No. 5,572,054, whose disclosure is incorporated herein by reference with regard to the operation and theory of operation of a non-volatile memory cell having a floating gate, gate to gate tunneling, and an array of memory cells formed thereby.

To erase a selected memory cell in any given active region 22, a ground potential is applied to its source 42 and its select and control gates 52 and 36. A high-positive voltage (e.g. +10-12 volts) is applied to its erase gate 50. Electrons on the floating gate 32 are induced through the Fowler-Nordheim tunneling mechanism to tunnel from the floating gate 32, through the layer 40, and onto the erase gate 50, leaving the floating gate 32 positively charged. It should be noted that since each erase gate 50 faces a pair of floating gates 32, both floating gates 32 in each pair will be erased at the same time.

When a selected memory cell is desired to be programmed, a small current (e.g. ~1 μA) is applied to its drain region 56. A positive voltage level in the vicinity of the threshold voltage of the MOS structure (on the order of approximately +0.2 to 1 volt above the drain 56) is applied to its select gate 52, and a voltage of 8-10 V is applied to its control gate 36. A positive high voltage (e.g. on the order of 5 to 10 volts) is applied to its source region 42. Because the floating gate 32 is highly capacitively coupled to the control gate 36, the floating gate 32 "sees" a voltage potential of on the order of +4 to +8 volts. Electrons generated by the drain region 56 will flow from that region towards the source region 42 through the deeply depleted horizontal and vertical portions 62a/62b of the channel region 62. As the electrons reach the upper end of the vertical portion 62b of the channel region 62, where they accelerate due to the large potential drop across the gap region between the channel region portions 62a and 62c (because the floating gate 32 is strongly voltage-coupled to the positively charged control gate 36). The electrons will accelerate and become heated, with most of them being injected into and through oxide layer 30 and onto the floating gate 32, thus negatively charging the floating gate 32. Low or ground potential is applied to the source/drain regions 42/56 and control/select gates 36/52 for memory cell rows/columns not containing the selected memory cell. Thus, only the memory cell in the selected row and column is programmed.

The injection of electrons onto the floating gate 32 will continue until the reduction of the charge on the floating gate 32 can no longer sustain a high surface potential in the gap area at the near end of channel region 62c. At that point, the electrons or the negative charges in the floating gate 32 will decrease the electron flow from the drain region 56 onto the floating gate 32.

Finally, to read a selected memory cell, ground potential is applied to its source region 42. A read bias voltage (e.g. ~0.6 to 1 volt) is applied to its drain region 56, a bias voltage (e.g. 0-3 V) is applied to its control gate 36, and a bias voltage of approximately 1 to 4 volts (depending upon the power supply voltage of the device) is applied to its select gate 52. If the floating gate 32 is positively charged (i.e. the floating gate is discharged of electrons), then the horizontal channel region portion 62c (under the floating gate 32) is turned on. When the select gate 52 is raised to the read potential, the horizontal and vertical channel region portions 62a/62b (adjacent the select gate 52) are also turned on. Thus, the entire channel region 62 will be turned on, causing electrons to flow from the source region 42 to the drain region 56. This sensed electrical current would be the "1" state.

On the other hand, if the floating gate 32 is negatively charged, the horizontal channel region portion 62c is either weakly turned on or is entirely shut off. Even when the select gate 52 and the drain region 56 are raised to their read potentials, little or no current will flow through horizontal channel region portion 62c. In this case, either the current is very small compared to that of the "1" state or there is no current at all. In this manner, the memory cell is sensed to be programmed at the "0" state. Ground potential is applied to the source/drain regions 42/56 and select gates 52 for non-selected columns and rows so only the selected memory cell is read.

The memory cell array includes peripheral circuitry including conventional row address decoding circuitry, column address decoding circuitry, sense amplifier circuitry, output buffer circuitry and input buffer circuitry, which are well known in the art.

The present invention provides a memory cell array with superior program efficiencies for any given size memory cell. The program efficiency is enhanced in two ways. First, by forming the select gate in a trench that extends into the substrate, the length of the channel region portion controlled by the selected gate can be increased without increasing the lateral size of the memory cell. The increased length of this portion of the channel region allows the electrons to better accelerate before reaching the floating gate. Second, burying the select gate into the substrate results in a vertical portion 62b of the channel region 62 that is directly aimed at the floating gate 32. This means that the accelerated electrons are traveling directly toward the floating gate 32, which results in greater hot electron tunneling compared to electrons traveling parallel to the insulation layer through which they tunnel. The improved programming efficiency is important for a technology in which the overall memory cell geometry is constantly being scaled down in size. While most feature dimensions can and are being scaled down, the length of channel region portion used for programming is either reduced at a lesser extent, is preserved, or even is increased for better program efficiency. The present invention runs counter to the general trend that reduced memory cell size means all critical dimensions are reduced in size and length. Finally, having source region 42 and drain region 56 separated vertically as well as horizontally allows for easier optimization of reliability parameters without affecting cell size.

It is to be understood that the present invention is not limited to the embodiment(s) described above and illustrated herein, but encompasses any and all variations falling within the scope of the appended claims. For example, trench 46 can end up having any shape that extends into the substrate, with sidewalls that are or are not oriented vertically, not just the elongated rectangular shape shown in the figures. Although the foregoing method describes the use of appropriately doped polysilicon as the conductive material used to form the memory cells, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material having etch properties that differ from that of silicon dioxide (or any insulator) and from polysilicon (or any conductor) can be used. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate, which are regions that are doped to have a different conductivity type compared to other portions of the substrate. Single layers of insulating or conductive material could be formed as multiple layers of such materials, and vice versa. Lastly, the select gates 52 are shown, but need not have, upper portions that extend out of third trenches 46.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. An electrically programmable and erasable memory device comprising:
   a substrate of semiconductor material having a first conductivity type and a surface;
   a trench formed into the surface of the substrate;
   first and second spaced-apart regions formed in the substrate and having a second conductivity type, with a channel region in the substrate there between, wherein the second region is formed under the trench, and the channel region includes a first portion that extends substantially along a bottom wall of the trench, a second portion that extends substantially along a sidewall of the trench, and a third portion that extends substantially along the surface of the substrate;
   an electrically conductive floating gate disposed over and insulated from the channel region third portion for controlling a conductivity of the channel region third portion;
   an electrically conductive control gate disposed adjacent to and insulated from the floating gate;
   an electrically conductive select gate at least partially disposed in the trench and adjacent to and insulated from the channel region first and second portions for controlling a conductivity of the channel region first and second portions; and
   an electrically conductive erase gate disposed adjacent to and insulated from the floating gate.

2. The device of claim 1, wherein the erase gate is disposed over and insulated from the first region.

3. The device of claim 1, wherein the select gate includes an upper portion thereof that extends out of the trench.

4. The device of claim 1, wherein the control gate is disposed over and insulated from the floating gate.

5. The device of claim 1, further comprising:
   a second trench formed into the surface of the substrate;
   a third region formed in the substrate and having a second conductivity type, with a second channel region in the substrate between the first and third regions, wherein the third region is formed under the second trench, and the second channel region includes a first portion that extends substantially along a bottom wall of the second trench, a second portion that extends substantially along a sidewall of the second trench, and a third portion that extends substantially along the surface of the substrate;
   an electrically conductive second floating gate disposed over and insulated from the second channel region third portion for controlling a conductivity of the second channel region third portion;
   an electrically conductive second control gate disposed adjacent to and insulated from the second floating gate; and
   an electrically conductive second select gate at least partially disposed in the second trench and adjacent to and insulated from the second channel region first and second portions for controlling a conductivity of the second channel region first and second portions;
   wherein the erase gate is disposed adjacent to and insulated from the second floating gate.

6. An array of electrically programmable and erasable memory devices comprising:
   a substrate of semiconductor material having a first conductivity type and a surface;
   spaced apart isolation regions formed on the substrate which are substantially parallel to one another and extend in a first direction, with an active region between each pair of adjacent isolation regions; and
   each of the active regions including a plurality of pairs of memory cells, wherein each of the memory cell pairs comprises:
      a pair of trenches formed into the surface of the substrate,
      a pair of second regions each formed in the substrate under one of the pair of trenches,
      a first region formed in the substrate, wherein a pair of channel regions are each in the substrate between the first region and one of the second regions, wherein the first and second regions have a second conductivity type, and wherein each of the channel regions includes a first portion that extends substantially along a bottom wall of one of the trenches, a second portion that extends substantially along a sidewall of that one trench, and a third portion that extends substantially along the substrate surface,
      a pair of electrically conductive floating gates each disposed over and insulated from one of the channel region third portions for controlling a conductivity of that channel region third portion,
      a pair of an electrically conductive control gates disposed adjacent to and insulated from one of the floating gates,
      a pair of electrically conductive select gates each at least partially disposed in one of the trenches and adjacent to and insulated from one of the channel region first and second portions for controlling a conductivity of those channel region first and second portions, and
      an electrically conductive erase gate disposed adjacent to and insulated from the pair of floating gates.

7. The array of claim 6, wherein for each of the memory cell pairs, the erase gate is disposed over and insulated from the first region.

8. The array of claim 6, wherein for each of the memory cell pairs, each of the select gate includes an upper portion thereof that extends out of one of the trenches.

9. The array of claim 6, wherein for each of the memory cell pairs, each of the control gates is disposed over and insulated from one of the floating gates.

10. A method of forming a semiconductor memory cell, comprising:
   forming a trench into a surface of the substrate of semiconductor material having a first conductivity type;
   forming first and second spaced-apart regions in the substrate having a second conductivity type, with a channel region in the substrate there between, wherein the second region is formed under the trench, and the channel region includes a first portion that extends substantially along a bottom wall of the trench, a second portion that extends substantially along a sidewall of the trench, and a third portion that extends substantially along the surface of the substrate;
   forming an electrically conductive floating gate disposed over and insulated from the channel region third portion for controlling a conductivity of the channel region third portion;
   forming an electrically conductive control gate disposed adjacent to and insulated from the floating gate;
   forming an electrically conductive select gate at least partially disposed in the trench and adjacent to and insulated from the channel region first and second portions for controlling a conductivity of the channel region first and second portions; and
   forming an electrically conductive erase gate disposed adjacent to and insulated from the floating gate.

11. The method of claim 10, wherein the erase gate is disposed over and insulated from the first region.

12. The method of claim 10, wherein the select gate includes an upper portion thereof that extends out of the trench.

13. The method of claim 10, wherein the control gate is disposed over and insulated from the floating gate.

14. The method of claim 10, further comprising:
   forming a second trench into the surface of the substrate;
   forming a third region in the substrate having a second conductivity type, with a second channel region in the substrate between the first and third regions, wherein the third region is formed under the second trench, and the second channel region includes a first portion that extends substantially along a bottom wall of the second trench, a second portion that extends substantially along a sidewall of the second trench, and a third portion that extends substantially along the surface of the substrate;
   forming an electrically conductive second floating gate disposed over and insulated from the second channel region third portion for controlling a conductivity of the second channel region third portion;
   forming an electrically conductive second control gate disposed adjacent to and insulated from the second floating gate; and
   forming an electrically conductive second select gate at least partially disposed in the second trench and adjacent to and insulated from the second channel region first and second portions for controlling a conductivity of the second channel region first and second portions;
   wherein the erase gate is disposed adjacent to and insulated from the second floating gate.

15. A method of forming an array of electrically programmable and erasable memory devices, comprising:
   forming spaced apart isolation regions on a semiconductor substrate that are substantially parallel to one another and extend in a first direction, with an active region between each pair of adjacent isolation regions, wherein the substrate has a surface and a first conductivity type; and
   forming a plurality of pairs of memory cells in each of the active regions, wherein the formation of each of the memory cell pairs includes:
      forming a pair of trenches into the surface of the substrate,
      forming a pair of second regions in the substrate each disposed under one of the pair of trenches,
      forming a first region in the substrate, wherein a pair of channel regions are each in the substrate between the first region and one of the second regions, wherein the first and second regions have a second conductivity type, and wherein each of the channel regions includes a first portion that extends substantially along a bottom wall of one of the trenches, a second portion that extends substantially along a sidewall of that one trench, and a third portion that extends substantially along the substrate surface,
      forming a pair of electrically conductive floating gates each disposed over and insulated from one of the channel region third portions for controlling a conductivity of that channel region third portion,
      forming a pair of an electrically conductive control gates disposed adjacent to and insulated from one of the floating gates,
      forming a pair of electrically conductive select gates each at least partially disposed in one of the trenches and adjacent to and insulated from one of the channel region first and second portions for controlling a conductivity of those channel region first and second portions, and
      forming an electrically conductive erase gate disposed adjacent to and insulated from the pair of floating gates.

16. The method of claim 15, wherein for each of the memory cell pairs, the erase gate is disposed over and insulated from the first region.

17. The method of claim 15, wherein for each of the memory cell pairs, each of the select gates includes an upper portion thereof that extends out of one of the trenches.

18. The method of claim 15, wherein for each of the memory cell pairs, each of the control gates is disposed over and insulated from one of the floating gates.

* * * * *